(12) United States Patent
Saga

(10) Patent No.: US 8,877,851 B2
(45) Date of Patent: Nov. 4, 2014

(54) GRAPHITE FILLED POLYESTER COMPOSITIONS

(71) Applicant: Yuji Saga, Utsunomiya (JP)

(72) Inventor: Yuji Saga, Utsunomiya (JP)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/788,198

(22) Filed: Mar. 7, 2013

(65) Prior Publication Data

US 2013/0292603 A1    Nov. 7, 2013

(30) Foreign Application Priority Data

May 2, 2012 (JP) ................. 2012-116945

(51) Int. Cl.
| | | |
|---|---|---|
| *B60C 1/00* | (2006.01) | |
| *B01F 17/00* | (2006.01) | |
| *C08L 67/00* | (2006.01) | |
| *H01L 23/373* | (2006.01) | |
| *H01L 33/56* | (2010.01) | |

(52) U.S. Cl.
CPC ..... *H01L 23/3737* (2013.01); *H01L 2924/0002* (2013.01); *C08L 67/00* (2013.01); *H01L 33/56* (2013.01)
USPC ........................... 524/495; 524/601; 524/494

(58) Field of Classification Search
USPC ......................................... 524/495, 601, 494
See application file for complete search history.

(56) References Cited

U.S. PATENT DOCUMENTS

| | | | |
|---|---|---|---|
| 6,255,758 B1 * | 7/2001 | Cabuz et al. ................ | 310/309 |
| 6,620,497 B2 | 9/2003 | Smith et al. | |
| 7,588,826 B2 | 9/2009 | Zaghib et al. | |
| 2006/0018123 A1 | 1/2006 | Rose | |
| 2007/0121326 A1 | 5/2007 | Nall et al. | |
| 2007/0213458 A1 | 9/2007 | Topoulos | |
| 2008/0057333 A1 | 3/2008 | Chu | |
| 2009/0152491 A1 | 6/2009 | Saga | |
| 2009/0303719 A1 | 12/2009 | Ko | |
| 2010/0254128 A1 | 10/2010 | Pickard et al. | |
| 2011/0040007 A1 | 2/2011 | Chandrasekhar et al. | |
| 2011/0196098 A1 | 8/2011 | Metlach et al. | |

FOREIGN PATENT DOCUMENTS

| | | |
|---|---|---|
| EP | 1821030 | 8/2007 |
| EP | 3387244 | 5/2010 |
| WO | 0232998 | 4/2002 |
| WO | 2011007687 | 1/2011 |
| WO | 2011038074 | 3/2011 |

OTHER PUBLICATIONS

Aluminum Nitride, AIN Ceramic Properties pp. 1-2, obtained online from http://accuratus.com/alumni.html.*
Graphite Mineral Data pp. 1-4, obtained online from http://www.webmineral.com/data/Graphite.shtml.*
Poly(ethylene terephthalate), pp. 1-2, obtained online from http://www.polymerprocessing.com/polymers/PET.html.*

* cited by examiner

*Primary Examiner* — Alexander Kollias
(74) *Attorney, Agent, or Firm* — Loretta Smith; Otha Weaver

(57) ABSTRACT

Polyester compositions comprising:
  3 to 40 weight percent, preferably 3 to 30 weight percent, of at least one polyester, preferably polybutylene terephthalate, polytrimethylene terephthalate, polyethylene terephthalate, poly(ethylene 2,6-naphthoate), and poly (1,4-cyclohexyldimethylene terephthalate);
  25 to 50 weight percent non-fibrous graphite, preferably a platy or particulate graphite;
  10 to 40 weight percent inorganic filler selected from the group consisting of wollastonite, glass fibers, aramid fibers, ceramic fibers, potassium titanate whiskers, or combinations of them;
  3 to 10 weight percent copolyether ester elastomer;
wherein:
the amount of a+b+c+d is 100 weight percent of the composition;
the amount of b+c is at least 50 weight percent of the composition; the weight ratio of copolyether ester elastomer to polyester is from 0.3 to 0.4; and the composition has at least a 0.2 percent elongation, a thermal conductivity of at least 3 WmK, and a tensile strength of at least 25 MPa. Articles prepared from these compositions.

14 Claims, No Drawings

GRAPHITE FILLED POLYESTER COMPOSITIONS

CROSS REFERENCE TO RELATED APPLICATIONS

This application claims the benefit of priority pursuant to 35 U.S.C. 119(a-d) from Japanese Application No. JP2012-116945 filed 2 May 2012, and currently pending.

OVERVIEW

Described herein are polyester compositions having good ductility and thermally conductivity and more specifically to polyester compositions comprising polyesters, a copolyether ester elastomer, and high levels of graphite. These compositions are useful in the manufacture of light emitting diode (LED) assemblies.

Replacing incandescent bulbs with LEDs as a light source is experiencing an exponential increase not only because of LEDs' lower cost but also for their lower energy consumption, longer lifetime, improved robustness, and smaller size. However, replacing compact fluorescent lamps with LEDs is not yet experiencing a similar increase because LED wattage powerful enough for ambient room lighting is relatively more expensive and requires more precise current and heat management than compact fluorescent lamp sources of comparable output.

Since management of heat generated by LEDs as a replacement light source is critical to assure a long LED, LED housings are needed that can rapidly dissipate the heat generated by the LED.

DETAILED DESCRIPTION OF THE INVENTION

Definitions and Abbreviations

The following definitions and abbreviations are to be used to interpret the meaning of the terms discussed in the description and recited in the claims.

As used herein, the terms "light-emitting diode assembly" or "LED assembly" refer to a device comprising at least one light-emitting semiconductor diode, an electrical connection capable of connecting the diode to an electrical circuit, and a housing partially surrounding the diode. The LED assembly may optionally have a lens that fully or partially covers the LED. As used herein, the terms "LED housing" or "housing" refer to a structural element of an LED assembly of which at least part, preferably all, of the structural element comprises the polyester composition disclosed herein and wherein the housing partially or completely surrounds the diode so as to form a cavity around the diode with the housing having an opening for the light emitted by the diode to exit.

As used herein, the term "non-fibrous graphite" refers to graphite particles that are not in the form of fibers such as graphite powder, graphite particles, and graphite flakes. The graphite can be naturally occurring graphite or synthetic graphite. Non-fibrous graphite has an aspect ratio (length to width ratio) of less than 2. Such particles are typically round, oval, flat, or irregular in shape.

As used herein, the term "fiber" refers to thin, threadlike solid particles and having an average length at least 2 times the average diameter, i.e. an aspect ratio of at least 2.

As used herein, the term "long-chain ester units" as applied to units in a polymer chain refers to the reaction product of a long-chain glycol with a dicarboxylic acid.

As used herein, the term "short-chain ester units" as applied to units in a polymer chain of the copolyether ester elastomer refers to low molecular weight compounds or polymer chain units having molecular weights less than about 550.

As used herein, the term "aliphatic dicarboxylic acids" refers to carboxylic acids having two carboxyl groups each attached to a saturated carbon atom.

As used herein, the term "aromatic dicarboxylic acids" refers to dicarboxylic acids having two carboxyl groups each attached to a carbon atom in a carbocyclic aromatic ring structure.

As used herein, the term "MPa" is an abbreviation for mega Pascals.

Ranges

Any range set forth herein expressly includes its endpoints unless explicitly stated otherwise. Setting forth an amount, concentration, or other value or parameter as a range specifically discloses all ranges formed from any pair of any upper range limit and any lower range limit, regardless of whether such pairs are separately disclosed herein. The processes and articles described herein are not limited to the specific values disclosed in defining a range in the description.

Preferred Variants

The disclosure herein of any variants in terms of materials, methods, steps, values, and/or ranges, etc.—whether identified as preferred variants or not—of the processes, compositions and articles described herein is specifically intended to disclose any process and article that includes ANY combination of such materials, methods, steps, values, ranges, etc. For the purposes of providing photographic and sufficient support for the claims, any such disclosed combination is specifically intended to be a preferred variant of the processes, compositions, and articles described herein.

Generally

Described herein are compositions comprising at least one polyester, non-fibrous graphite, and at least one inorganic filler. The compositions comprise
a) 3 to 40 weight percent, preferably 3 to 30 weight percent, of at least one polyester, preferably polybutylene terephthalate, polytrimethylene terephthalate, polyethylene terephthalate, poly(ethylene 2,6-naphthoate), and poly(1,4-cyclohexyldimethylene terephthalate);
b) 30 to 50 weight percent non-fibrous graphite, preferably a platy or particulate graphite;
c) 10 to 40 weight percent inorganic filler selected from the group consisting of wollastonite, glass fibers, aramid fibers, ceramic fibers, potassium titanate whiskers, or combinations of them;
d) 3 to 10 weight percent copolyether ester elastomer;
wherein:
  the amount of a+b+c+d is 100 weight percent of the composition;
  the amount of b+c is at least 50 weight percent of the r composition
  the weight ratio of copolyether ester elastomer to polyester is from 0.3 to 0.4; and
  the composition has at least a 0.2 percent elongation, a thermal conductivity of at least 3 WmK, and a tensile strength of at least 25 MPa.

In any of these compositions,
the amount of non-fibrous graphite ranges preferably from 30 to 45, and more preferably from 32 to 42 weight percent, of the total weight of the composition;
the non-fibrous graphite is preferably a platy or particular graphite;

the amount of copolyether ester elastomer ranges from 5 to 10 weight percent of the total weight of the composition;
the amount of inorganic filler ranges from 15 to 30 weight percent of the total weight of the composition. To be clear, it is contemplated that any weight percent within the range disclosed for a particular component may be used in any of the compositions described herein.

Also described herein are LED housings having good thermal conductivity and ductility comprising any of the compositions described in the preceding paragraph and disclosed and recited herein.

Compositions Described Herein

The compositions described herein contain from 3 to 40 weight percent polyester, from 30 to 50 weight percent non-fibrous graphite, from 10 to 40 weight percent inorganic filler, and from 3 to 10 weight percent copolyester ether, with the weight percents based on the total weight of the composition. These compositions have good ductility especially, terms of tensile elongation and thermal conductivity. The compositions described herein have at least a 0.2 percent elongation, a thermal conductivity of at least 3 WmK, and a tensile strength of at least 25 MPa.

The compositions described herein may be used to make LED housings because these compositions have sufficient ductility and tensile strength to prevent the LED housings from breaking or cracking during normal operation. At the same time, the compositions must also exhibit sufficient thermal conductivity to prevent the LED housings from overheating and thereby to prevent a fire hazard. This combination of elongation, thermal conductivity, and tensile strength properties in a composition comprising polyester has not yet been achieved.

Polyesters

The compositions described herein may comprise polyesters derived from one or more dicarboxylic acids and one or more diols having more than two carbon atoms. The amount of polyester in these compositions ranges from 3 to 40 weight percent, and more preferably, from 3 to 30 weight percent based on the total weight of the composition.

The one or more dicarboxylic acids may include esters. In preferred polyesters, the dicarboxylic acids include one or more of terephthalic acid, isophthalic acid, and 2,6-naphthalene dicarboxylic acid, and combinations of these. Other dicarboxylic acids that may be used to form the polyester include sebacic and adipic acids. Hydroxycarboxylic acids such as hydroxybenzoic acid may be used as comonomers.

The diol component useful in preparing the polyesters described herein include one or more of HO(CH2)n(I); 1,4-cyclohexanedimethanol; HO(CH2CH2O)mCH2CH2OH (II); and HO(CH2CH2CH2CH2O)zCH2CH2CH2CH2OH (III), wherein n is an integer of 2 to 10, m on average is 1 to 4, and z is on average about 7 to about 40. (II) and (III) may be a mixture of compounds in which m and z vary but are not necessarily integers as m and z are averages.

Suitable polyesters include, without limitation, poly(ethylene terephthalate) (PET), poly(trimethylene terephthalate) (PTT), poly(1,4-butylene terephthalate) (PBT), poly(ethylene 2,6-naphthoate) (PEN), and poly(1,4-cyclohexyldimethylene terephthalate) (PCT) and copolymers and blends of the same. Of these, preferred are poly(ethylene terephthalate) (PET), poly(trimethylene terephthalate) (PTT), and poly(1,4-butylene terephthalate) (PBT) with PBT most preferred. Examples of commercially available polyesters include Crastin® PBT polyester resins, Rynite® poly(ethylene terephthalate) polyester resins, and Sorona polyester resins, all available from E.I. du Pont de Nemours and Co., Wilmington, Del.

Non-Fibrous Graphite

The non-fibrous graphite described herein includes graphite particles that are not in the form of fibers and include graphite powder, graphite particles, and graphite flakes. The non-fibrous graphite can be naturally occurring graphite or synthetic graphite.

As used herein, "fibers" refer to thin, threadlike solid particles and have an average length at least 2 times the average diameter, i.e. an aspect ratio of at least 2. An aspect ratio of 2 means the fiber has a length which is twice the width of the fiber.

Non-fibrous graphite particles, flakes, or powders described herein have an aspect ratio of less than 2, preferably less than 1.5. This means that the particle is typically round, oval, flat, or irregular in shape as long as the length to width ratio of the particle, flake or powder, is less than 2, preferably less than 1.5, and even more preferably less than 1.2. Examples of non-fibrous graphite for use herein are available from Ito Kokuen, Japan.

The particle size of the non-fibrous graphite described herein can range from about 5 to 200 microns, preferably from 30 to 150 microns, and more preferably from 40 to 100 microns.

The amount of non-fibrous graphite present in the compositions described herein ranges from about 25 to 50 weight percent, preferably from about 30 to 50 weight percent based on the total weight of the polyester composition.

Inorganic Fillers

The inorganic fillers described herein can be any inorganic filler such as calcium carbonate, carbon fibers, talc, mica, wollastonite, calcined clay, kaolin, magnesium sulfate, magnesium silicate, barium sulfate, titanium dioxide, sodium aluminum carbonate, barium ferrite, and potassium titanate fibers or whiskers. Preferably, the inorganic fillers may be wolllastonite, glass fibers, aramid fibers, ceramic fibers, potassium titanate whiskers, and combinations of them.

When present, the inorganic filler ranges from about 10 to about 40 weight percent, preferably from about 15 to about 30 weight percent, the weight percents based on the total weight of the composition.

The amount of non-fibrous graphite and inorganic filler in the polyester composition is preferably greater than 50 weight percent. To be clear, the weight percent of the non-fibrous graphite plus the weight percent of the inorganic filler must be at least 50 weight percent of the total weight percent of the composition.

Copolyether Ester Elastomers

Suitable copolyether ester elastomers in the compositions described herein have a multiplicity of recurring long-chain ester units and short-chain ester units joined head-to-tail through ester linkages, said long-chain ester units being represented by formula (A):

(A)

and said short-chain ester units being represented by formula (B):

(B)

wherein G is a divalent radical remaining after the removal of terminal hydroxyl groups from poly(alkylene oxide)glycols having a number average molecular weight of between about 400 and about 6000, or preferably between about 400 and about 3000; R is a divalent radical remaining after removal of carboxyl groups from a dicarboxylic acid having a molecular weight of less than about 300; D is a divalent radical remaining after removal of hydroxyl groups from a diol having a molecular weight less than about 250.

As used herein, the term "long-chain ester units" as applied to units in a polymer chain refers to the reaction product of a long-chain glycol with a dicarboxylic acid. Suitable long-chain glycols are poly(alkylene oxide)glycols having terminal (or as nearly terminal as possible) hydroxyl groups and having a number average molecular weight of from about 400 to about 6000, and preferably from about 600 to about 3000. Preferred poly(alkylene oxide)glycols include poly(tetramethylene oxide)glycol, poly(trimethylene oxide)glycol, poly (propylene oxide)glycol, poly(ethylene oxide)glycol, copolymer glycols of these alkylene oxides, and block copolymers such as ethylene oxide-capped poly(propylene oxide)glycol. Mixtures of two or more of these glycols can be used.

As used herein, the term "short-chain ester units" as applied to units in a polymer chain of the copolyether ester elastomer refers to low molecular weight compounds or polymer chain units having molecular weights less than about 550. These units are made by reacting a low molecular weight diol or a mixture of diols (molecular weight below about 250) with a dicarboxylic acid to form ester units represented by Formula (B) above. Included among the low molecular weight diols that react to form suitable short-chain ester units are acyclic, alicyclic and aromatic dihydroxy compounds. Preferred are diols with about 2-15 carbon atoms such as ethylene, propylene, isobutylene, tetramethylene, 1,4-pentamethylene, 2,2-dimethyltrimethylene, hexamethylene and decamethylene glycols, dihydroxycyclohexane, cyclohexane dimethanol, resorcinol, hydroquinone, 1,5-dihydroxynaphthalene, etc. Especially preferred are aliphatic diols containing 2-8 carbon atoms, and a more preferred diol is 1,4-butanediol. Included among the bisphenols which can be used are bis(p-hydroxy)diphenyl, bis(p-hydroxyphenyl)methane, and bis(p-hydroxyphenyl)propane. Equivalent ester-forming derivatives of diols are also useful.

These materials are made by reacting a low molecular weight diol or a mixture of diols (molecular weight below about 250) with a dicarboxylic acid to form ester units represented by Formula (B) above. Included among the low molecular weight diols that react to form short-chain ester units suitable for use in preparing copolyether ester elastomers are acyclic, alicyclic and aromatic dihydroxy compounds. Preferred compounds are diols with about 2-15 carbon atoms such as ethylene, propylene, isobutylene, tetramethylene, 1,4-pentamethylene, 2,2-dimethyltrimethylene, hexamethylene and decamethylene glycols, dihydroxycyclohexane, cyclohexane dimethanol, resorcinol, hydroquinone, 1,5-dihydroxynaphthalene, etc. Especially preferred diols are aliphatic diols containing 2-8 carbon atoms, and a more preferred diol is 1,4-butanediol. Included among the bisphenols which can be used are bis(p-hydroxy) diphenyl, bis(p-hydroxyphenyl)methane, and bis(p-hydroxyphenyl)propane. Equivalent ester-forming derivatives of diols are also useful.

As used herein, the term "diols" includes equivalent ester-forming derivatives such as those mentioned. Any molecular weight requirements refer to the corresponding diols, not their derivatives.

Dicarboxylic acids that can react with the foregoing long-chain glycols and low molecular weight diols to produce the copolyether ester elastomers are aliphatic, cycloaliphatic or aromatic dicarboxylic acids of a low molecular weight, i.e., having a molecular weight of less than about 300. The term "dicarboxylic acids" as used herein includes functional equivalents of dicarboxylic acids that have two carboxyl functional groups that perform substantially like dicarboxylic acids in reaction with glycols and diols in forming copolyether ester elastomers. These equivalents include esters and ester-forming derivatives such as acid halides and anhydrides. The molecular weight requirement pertains to the acid and not to its equivalent ester or ester-forming derivative.

Thus, an ester of a dicarboxylic acid having a molecular weight greater than 300 or a functional equivalent of a dicarboxylic acid having a molecular weight greater than 300 are included provided the corresponding acid has a molecular weight below about 300. The dicarboxylic acids can contain any substituent group(s) or combination that does not substantially interfere with the copolyether ester elastomer formation.

As used herein, the term "aliphatic dicarboxylic acids" refers to carboxylic acids having two carboxyl groups each attached to a saturated carbon atom. If the carbon atom to which the carboxyl group is attached is saturated and is in a ring, the acid is cycloaliphatic. Aliphatic or cycloaliphatic acids having conjugated unsaturation often cannot be used because homopolymerization results. However, some unsaturated acids, such as maleic acid, can be used.

As used herein, the term "aromatic dicarboxylic acids" refers to dicarboxylic acids having two carboxyl groups each attached to a carbon atom in a carbocyclic aromatic ring structure. It is not necessary that both functional carboxyl groups be attached to the same aromatic ring and where more than one ring is present, they can be joined by aliphatic or aromatic divalent radicals or divalent radicals such as —O— or —SO2-. Representative useful aliphatic and cycloaliphatic acids that can be used include sebacic acid; 1,3-cyclohexane dicarboxylic acid; 1,4-cyclohexane dicarboxylic acid; adipic acid; glutaric acid; 4-cyclohexane-1,2-dicarboxylic acid; 2-ethylsuberic acid; cyclopentanedicarboxylic acid decahydro-1,5-naphthylene dicarboxylic acid; 4,4'-bicyclohexyl dicarboxylic acid; decahydro-2,6-naphthylene dicarboxylic acid; 4,4'-methylenebis(cyclohexyl) carboxylic acid; and 3,4-furan dicarboxylic acid. Preferred acids are cyclohexane dicarboxylic acids and adipic acid.

Representative aromatic dicarboxylic acids include phthalic, terephthalic and isophthalic acids; dibenzoic acid; substituted dicarboxyl compounds with two benzene nuclei such as bis(p-carboxyphenyl)methane; p-oxy-1,5-naphthalene dicarboxylic acid; 2,6-naphthalene dicarboxylic acid; 2,7-naphthalene dicarboxylic acid; 4,4'-sulfonyl dibenzoic acid and C1-C12 alkyl and ring substitution derivatives thereof, such as halo, alkoxy, and aryl derivatives. Hydroxy acids such as p-(beta-hydroxyethoxy)benzoic acid can also be used provided an aromatic dicarboxylic acid is also used.

Aromatic dicarboxylic acids are a preferred class for preparing the copolyether ester elastomers described herein. Among the aromatic acids, those with 8-16 carbon atoms are preferred, particularly terephthalic acid alone or in a mixture of phthalic and/or isophthalic acids.

The copolyether ester elastomers described herein preferably comprise from about 15 to about 99 weight percent short-chain ester units corresponding to Formula (B) above, the remainder being long-chain ester units corresponding to Formula (A) above. More preferably, the copolyether ester elastomers described herein comprise from at or about 20 to at or about 95 weight percent, and even more preferably from at or about 50 to at or about 90 weight percent short-chain ester units, where the remainder comprises long-chain ester units. More preferably, at least about 70% of the groups represented by R in Formulae (A) and (B) above are 1,4-phenylene radicals and at least about 70% of the groups represented by D in Formula (B) above are 1,4-butylene radicals and the sum of the percentages of R groups which are not 1,4-phenylene radicals and D groups that are not 1,4-butylene radicals does not exceed 30%. If a second dicarboxylic acid is used to prepare the copolyether ester elastomer, isophthalic acid is preferred and if a second low molecular weight diol is used, ethylene glycol, 1,3-propanediol, cyclohexanedimethanol, or hexamethylene glycol are preferred.

A blend or mixture of two or more copolyether ester elastomers may be used in the compositions described herein. That is, the weight percent of the copolyether ester elastomer—whether a single or a mixture is used—must fall within the range of short-chain ester units and/or long-chain ester units disclosed herein. For example, in a mixture that contains equal amounts of two copolyether ester elastomers, one copolyether ester elastomer can contain 60 weight percent short-chain ester units and the other resin can contain 30 weight percent short-chain ester units for a weighted average of 45 weight percent short-chain ester units.

Preferred copolyether ester elastomers include, but are not limited to, copolyether ester elastomers prepared from monomers comprising (1) poly(tetramethylene oxide)glycol; (2) a dicarboxylic acid selected from isophthalic acid, terephthalic acid and mixtures of these; and (3) a diol selected from 1,4-butanediol, 1,3-propanediol and mixtures of these, or from monomers comprising (1) poly(trimethylene oxide)glycol; (2) a dicarboxylic acid selected from isophthalic acid, terephthalic acid and mixtures of these; and (3) a diol selected from 1,4-butanediol, 1,3-propanediol and mixtures of these, or from monomers comprising (1) ethylene oxide-capped poly(propylene oxide)glycol; (2) dicarboxylic acid selected from isophthalic acid, terephthalic acid and mixtures of these; and (3) a diol selected from 1,4-butanediol, 1,3-propanediol and mixtures of these.

Preferably, the copolyether ester elastomers described herein are made from esters or mixtures of esters of terephthalic acid and/or isophthalic acid, 1,4-butanediol and poly(tetramethylene ether)glycol or poly(trimethylene ether)glycol or ethylene oxide-capped polypropylene oxide glycol, or are prepared from esters of terephthalic acid, e.g. dimethylterephthalate, 1,4-butanediol and poly(ethylene oxide)glycol. More preferably, the copolyether ester elastomers are prepared from esters of terephthalic acid, e.g. dimethylterephthalate, 1,4-butanediol and poly(tetramethylene ether) glycol.

Examples of suitable copolyether ester elastomers are commercially available under the trademark Hytrel® from E.I. du Pont de Nemours and Company, Wilmington, Del.

The amount of copolyether ester elastomer in the compositions described herein ranges from about 3 to about 10 weight percent, preferably from 5 to 10 weight percent, based on the total weight of the composition.

The weight ratio of the copolyether ester elastomer to polyester in the compositions described herein is from 0.3 to 0.4.

Additional Ingredients

The compositions described herein may further comprise one or more heat stabilizers, one or more oxidative stabilizers, one or more ultraviolet light stabilizers, one or more flame retardant agents or mixtures thereof, and other ingredients.

The one or more heat stabilizers may be copper salts and/or derivatives of these, hindered amine antioxidants, phosphorus antioxidants, and combinations of these. When present, the one or more heat stabilizers range from about 0.1 to about 3 weight percent, or preferably from about 0.1 to about 1 weight percent, the weight percents based on the total weight of the composition.

The one or more oxidative stabilizers may include, without limitation, phosphorus antioxidants (e.g. phosphite or phosphonite stabilizers), hindered phenol stabilizers, aromatic amine stabilizers, thioesters, and phenolic based anti-oxidants that hinder thermally induced oxidation of polymers where high temperature applications are used. When present, the one or more oxidative stabilizers range from about 0.1 to about 3 weight percent, or preferably from about 0.1 to about 1 weight percent, the weight percents based on the total weight of the composition.

The one or more flame retardant agents may include, without limitation, metal oxides (wherein the metal may be aluminum, iron, titanium, manganese, magnesium, zirconium, zinc, molybdenum, cobalt, bismuth, chromium, tin, antimony, nickel, copper and tungsten), metal powders (wherein the metal may be aluminum, iron, titanium, manganese, zinc, molybdenum, cobalt, bismuth, chromium, tin, antimony, nickel, copper and tungsten), metal salts such as zinc borate, zinc metaborate, barium metaborate, zinc carbonate, magnesium carbonate, calcium carbonate and barium carbonate, metal phosphinates (wherein the metal may be aluminum, zinc and calcium), halogenated organic compounds like decabromodiphenyl ether and halogenated epoxy compounds, halogenated polymer such as poly(bromostyrene) and brominated polystyrene, polymers of brominated styrenes, copolymer of a halostyrene and glycidyl(meth)acrylate, brominated epoxy resins, brominated polycarbonates, poly(pentabromobenzyl acrylate), phosphorus containing compounds such as polyphosphazenes, organophosphates and metal phosphinates, melamine pyrophosphate, melamine containing compound (such as melamine cyanurate), melamine polyphosphate, red phosphorus, and the like.

When used, the flame retardant will preferably range from about 3 to about 20 weight percent, based on the total weight of the composition.

Preferred flame retardants include halogenated polystyrene in combination with a flame retardant synergist. Flame retardant synergists may include, without limitation, any of antimony oxides, antimony pentoxide, sodium antimonate, zinc borate and the like.

LED Housings

Also described herein are LED housings made from compositions described herein and having good elongation, high thermal conductivity, and good tensile strength. Such LED housings can be easily made using commonly known polymer manufacturing processes and will result in lightweight LED assemblies. In particular, the compositions describe herein impart to LED housings both a good ductility and a thermal conductivity of at least 3 WmK as well as are easily moldable into a variety of LED housing shapes.

LED housings made from the compositions described herein in which the polyester compositions have a copolyether ester elastomer to polyester ratio of 0.3 to 0.4 exhibit both good ductility, as measured by elongation and tensile strength, and a thermal conductivity of at least 3 WmK. The polyester compositions described herein have at least a 0.2 percent elongation, a thermal conductivity of at least 3 WmK, and a tensile strength of at least 25 MPa.

LED housings described herein may arise from a single component or be assembled from multiple components, with one or more components being made the compositions described herein. For multiple-component LED housings described herein, some components may be metal, ceramic, or a polymeric composition different from the compositions described herein. LED housing component may be assembled into a housing from a variety of known assembly processes: mechanically, by gluing, by molding or overmolding a polymeric material over a metal or other polymeric part.

Making Compositions and Articles Described Herein

The polyester compositions described herein are melt-mixed blends, wherein all the polymeric components are well-dispersed within each other and all the non-polymeric ingredients are well-dispersed such that the blend forms a unified whole. They are made by blending the components in any order or combination, at any convenient temperature as long as the polymeric ingredients are in the melt or molten state. Blending or mixing temperatures are easily determined by one of knowledge in the art.

Any melt-mixing method may be used to combine the polymeric components and non-polymeric components. For example, the polymeric components and non-polymeric ingredients may be added to a melt mixer, such as a single or twin-screw extruder; a blender; a single or twin-screw kneader; or a Banbury mixer, either all at once through a single step addition, or in a stepwise fashion, and then melt-mixed. When adding the polymeric components and non-polymeric ingredients in a stepwise fashion, part of the polymeric components and/or non-polymeric ingredients are first added and melt-mixed with the remaining polymeric components and non-polymeric ingredients being subsequently added and further melt-mixed until a well-mixed composition is obtained. Pellets of these compositions can be made for future use in molding LED housings and other articles.

The polyester compositions described herein may be shaped into articles or LED housings using methods known to those skilled in the art, such as injection molding, blow molding, injection blow molding, extrusion, thermoforming, melt casting, vacuum molding, rotational molding, calendar molding, slush molding, filament extrusion and fiber spinning. Such articles may include films, fibers and filaments; wire and cable coating; photovoltaic cable coating, optical fiber coating, tubing and pipes; fabrics, films and membranes, such as breathable membranes in roofing and building/construction; motorized vehicles parts such as body panels, dashboards; components for household appliances, such as washers, dryers, refrigerators and heating-ventilation-air conditioning appliances; connectors in electrical/electronic applications; components for electronic devices, such as computers; a gear; a conveyor belt part; a bearing; a container for fuel; a part for an automotive safety restraint system.

Preferably, the LED housing or housing component made from the compositions described herein may be formed by any suitable melt-processing method known to those skilled in the art, such as injection molding or the like. The LED housing may be overmolded over a metal (such as copper or silver-coated copper) lead frame that can be used to make an electrical connection to an LED inserted into the housing.

LED housings described herein may be incorporated into LED assemblies, which may be used in applications that include, without limitation, traffic signals, large area displays (including video displays), video screens, interior and exterior lighting, cellular telephone display backlights, automotive displays, vehicle brake lights, vehicle head lamps, laptop computer display backlights, pedestrian floor illumination, and flashlights.

EXAMPLES

Examples (E) and Comparative Examples (C) below are intended to further explicate and not to limit the scope of the compositions and articles described herein.

Materials

PBT—Poly(butylene terephthalate) polyester having an intrinsic viscosity of 0.68 available from Chang Chun Petrochemical Co. LTD. as 1200 211E.

PTT—Poly(trimethylene terephthalate) polyester having an intrinsic viscosity of 1.02 available from E.I. DuPont PEEE—A copolyether ester elastomer having a melting point of 150° C. and a melt flow rate of 5.3 g/10 min. (ASTM D1238 2.16 kg) available from E.I. du Pont de Nemours and Company, Inc, Delaware, USA.

Graphite—A graphite powder having an average particle size of 41 microns available from Ito Kokuen as PC99-300M.

Glass Fiber—A chopped glass fiber having an average length of 3 mm available from Nippon Electric Glass Co. Ltd. as ECS03T-187H.

Wollastonite—Available from Nyco as NYAD G and having an average particle size of 40 microns.

FR-1 is a granular, brominated epoxy flame retardant having a mean molecular weight of 10,000 available as SR-T 5000 from Sakamoto Yakuhin Kogyo.

FR-2 is an antimony trioxide/Polyethylene (80/20 by weight) master batch PE/FR-80 available from Kawasaki Sanko Kasei.

MgO—magnesium oxide available from Ube Material Industries, Ltd

GCF—a graphitized carbon fiber having an aspect ratio of 20 available from Teijin Limited.

Additional ingredients may include one or all of a heat stabilizer, a lubricant, and a flow aid agent. These ingredients do not materially affect the physical properties of the compositions described herein.

Test Methods

Properties of Molded Compositions Described Herein

Thermal conductivity was measured in the in-plane direction using a laser flash method as described in ASTM E1461.

Elongation was measured using ISO 527-½ at 23° C.

Tensile strength was measured using ISO 527-½ at 23° C.

Flexural strength and flexural modulus were measured using ISO 178-½ at 23° C.

Making Composition Preparation

The compositions used in the Examples and Comparative Examples were prepared by melt blending the ingredients shown in Table 1 in an HTM-50 twin screw continuous kneading extruder, manufactured by CTE Co. Ltd., at temperatures of about 240-280° C. Upon exiting the extruder, the compositions were cooled and pelletized. The resulting compositions were molded into ISO test specimens on an injection molding machine for the measurement of mechanical properties, and into plates of pieces having dimensions 1 mm×16 mm×16 mm for thermal conductivity measurements.

Results

Table 1 shows the combination of properties compositions described herein achieve. E1 and E2 show that a polyester to copolyether ester elastomer ratio (PEEE/PBT ratio) of 0.3 to 0.4 drives an elongation of at least 0.2 percent, a thermal conductivity of at least 3 WmK, and a tensile strength of at least 25 MPa.

Comparative Examples C1 and C4 lack a PEEE/PBT ratio of 0.3 to 0.4 and therefore lack the recited combination of physical properties. Comparative Examples C2 and C3 lack copolyether ester elastomer and also do not exhibit the recited combination of physical properties.

Example E3 uses poly(trimethylene terephthalate) as the polyester. E3 has a PEEE/PTT ratio between 0.3 to 0.4 and exhibits a combination of good elongation, tensile strength, and thermal conductivity.

TABLE 1

|  | E1 | E2 | C1 | C2 | C3 | C4 | C5 | C6 | E3 |
|---|---|---|---|---|---|---|---|---|---|
| Ingredients | | | | | | | | | |
| Poly(butylene terephthalate) | 27.3 | 18.9 | 22.4 | 37.2 | 25.8 | 15.5 | 20.8 | 28.2 | 0 |
| Poly(trimethylene terephthalate) | | | | | | | | | 19.7 |
| Graphite | 35 | 40.4 | 40.2 | 35 | 40.0 | 40.6 | | | 40.3 |
| GCF | 0 | 0 | 0 | 0 | 0 | 0 | 32.9 | 32.5 | 0 |
| PEEE | 9.9 | 6.1 | 3.0 | 0 | 0 | 9.2 | 6.6 | 0 | 6.1 |
| Glass Fiber | 10 | 27.3 | 27.1 | 10 | 27.0 | 27.4 | 6.5 | 6.4 | 27.2 |
| Wollastonite | 10 | 0 | 0 | 10 | 0 | 0 | 0 | 0 | 0 |
| Magnesium Oxde | 0 | 0 | 0 | 0 | 0 | 0 | 26.8 | 26.5 | 0 |
| FR-1 | 6.2 | 4.9 | 4.9 | 6.2 | 4.9 | 5.0 | 4.7 | 4.6 | 4.9 |
| FR-2 | 1.6 | 1.8 | 1.8 | 1.6 | 1.9 | 1.9 | 1.7 | 1.7 | 1.8 |
| Miscellaneous additives | 0 | 0.5 | 0.5 | 0 | 0.5 | 0.5 | 0 | 0 | 0 |
| PEEE/Polymer* Ratio | 0.36 | 0.32 | 0.13 | N/A | N/A | 0.59 | 0.32 | N/A | 0.31* |
| Physical Properties | | | | | | | | | |
| Thermal Conductivity (W mK) | 7.8 | 9.5 | 10.5 | 6.3 | 8.2 | 7.1 | 5.5 | 6.6 | 8.6 |
| Elongation (%) | 0.2 | 0.3 | 0.1 | 0.1 | 0.1 | 0.2 | 0.29 | 0.19 | 0.26 |
| Tensile Strength (MPa) | 39 | 47 | 33 | 25 | 35 | 27 | 48 | 50 | 55 |
| Flexural Strength (MPa) | 68 | 83 | 89 | 66 | 92 | 78 | NM | NM | 101 |
| Flexural Modulus (GPa) | 20.0 | 21.0 | 25.0 | 24.6 | 27.6 | 17.6 | NM | NM | 26.6 |

N/A = not applicable
NM = not measured
*Polymer = either PBT or PTT, as applicable

The invention claimed is:

1. A polyester composition comprising:
   a) 3 to 40 weight percent of at least one polyester selected from the group consisting of polybutylene terephthalate, polytrimethylene terephthalate, polyethylene terephthalate, poly(ethylene 2,6-naphthoate), poly(1,4-cyclohexyldimethylene terephthalate), and combinations thereof;
   b) 25 to 50 weight percent of a platy or of a particulate non-fibrous graphite having an aspect ratio of less than 2;
   c) 10 to 40 weight percent of a inorganic filler having an aspect ratio of at least 2 selected from the group consisting of glass fibers, aramid fibers, ceramic fibers, potassium titanate fibers, and combinations thereof;
   d) 3 to 10 weight percent of a copolyether ester elastomer; wherein:
   the amount of a+b+c+d is 100 weight percent of the polyester composition;
   the amount of b+c is at least 50 weight percent of the polyester composition
   the weight ratio of the copolyether ester elastomer to the polyester is from 0.3 to 0.4; and
   the polyester composition has at least a 0.2 percent elongation, a thermal conductivity of at least 3 WmK, and a tensile strength of at least 25 MPa.

2. The polyester composition of claim 1, wherein the amount of the inorganic filler is from 15 to 30 weight percent of the polyester composition.

3. The polyester composition of claim 1, wherein amount of the platy or the particulate non-fibrous graphite is from 32 to 42 weight percent of the polyester composition, the amount of the copolyether ester elastomer is from 5 to 10 weight percent of the composition, and the amount of the inorganic filler is from 15 to 30 weight percent of the polyester composition.

4. The polyester composition of claim 1, wherein the amount of the platy or the particulate non-fibrous graphite is from 32 to 42 weight percent of the polyester composition.

5. The polyester composition of claim 4, wherein the amount of the copolyether ester elastomer is from 5 to 10 weight percent of the polyester composition.

6. The polyester composition of claim 4, wherein the amount of the inorganic filler is from 15 to 30 weight percent of the polyester composition.

7. The polyester composition of claim 1, wherein the amount of the copolyether ester elastomer is from 5 to 10 weight percent of the polyester composition.

8. The polyester composition of claim 7, wherein the amount of the platy or the particulate non-fibrous graphite is from 32 to 42 weight percent of the polyester composition.

9. A light emitting diode housing comprising at least one component comprising the polyester composition of claim 1.

10. The light emitting diode housing of claim 9, wherein the amount of the platy or the particulate non-fibrous graphite is from 32 to 42 weight percent of the polyester composition.

11. The light emitting diode housing of claim 9, wherein the amount of the copolyether ester elastomer is from 5 to 10 weight percent of the polyester composition.

12. The light emitting diode housing of claim 9, wherein the amount of the inorganic filler is from 15 to 30 weight percent of the polyester composition.

13. The light emitting diode housing of claim 9, wherein the amount of non-fibrous graphite is from 32 to 42 weight percent of the polyester composition and the amount of copolyether ester elastomer is from 5 to 10 weight percent of the polyester composition.

14. The light emitting diode housing of claim 9, wherein the amount of non-fibrous graphite is from 32 to 42 weight percent of the polyester composition; the amount of the copolyether ester elastomer is from 5 to 10 weight percent of the composition; and the amount of the inorganic filler is from 15 to 30 weight percent of the polyester composition.

* * * * *